(12) United States Patent
Tanaka (10) Patent No.: US 6,278,305 B1
(45) Date of Patent: Aug. 21, 2001

(54) SEMICONDUCTOR INTEGRATED CIRCUIT (75) Inventor: Isao Tanaka, Hirakata (JP)

(73) Assignee: Matsushita Electric Industrial, Ltd., Osaka (JP)

(*) Notice: Subject to any disclaimer, the term of this patent is extended or adjusted under 35 U.S.C. 154(b) by 0 days.

(21) Appl. No.: 09/244,966

(22) Filed: Feb. 5, 1999

(30) Foreign Application Priority Data

Feb. 9, 1998 (JP) .................................................. 10-027170

(51) Int. Cl.[7] ...................................................... H03K 5/12
(52) U.S. Cl. ............................................. 327/170; 327/333
(58) Field of Search .................................... 327/170, 333, 327/376, 383, 545, 546

(56) References Cited

U.S. PATENT DOCUMENTS 5,124,570 * 6/1992 Meno ..................................... 307/263
5,949,249 * 9/1999 Preuss et al. .......................... 326/27

FOREIGN PATENT DOCUMENTS 8-181593    7/1996 (JP) .

OTHER PUBLICATIONS

Patent Abstracts of Japan, publication No. 08181593A, publication date Jul. 12, 1996.

* cited by examiner

Primary Examiner—Toan Tran
Assistant Examiner—Cassandra Cox
(74) Attorney, Agent, or Firm—Rosenthal & Osha L.L.P.

(57) ABSTRACT

A semiconductor integrated circuit which achieves the low power consumption by the low voltage operation is disclosed. According to the semiconductor integrated circuit, the slew of the output waveform is appropriately controlled by controlling the power supply voltage supplied to driving circuit independently of the power supply voltage of the digital processing circuit.

The semiconductor integrated circuit includes a digital processing circuit 400, the slew adjustment circuit 200 for adjusting the slew of the transient response in the output waveform of the driving circuit 200 which inputs the output of the digital processing circuit 400, and a mode control circuit 300 for controlling the operation mode of the entire integrated circuit according to the detection result of the slew adjustment unit 200. The power supply voltage of the driving circuit 120 is set low at beginning, and the power supply voltage is boosted in case the transient response of the output waveform of the driving circuit 120 is more gradual than that of the slew of the reference. If transient response of the output waveform of the driving circuit 120 becomes steeper than the slew of the reference, the adjustment completion signal is output, the power supply voltage of the driving circuit is fixed, and the mode is shifted to the normal operation mode.

19 Claims, 7 Drawing Sheets

SEMICONDUCTOR INTEGRATED CIRCUIT

BACKGROUND OF THE INVENTION

1. Field of the Invention

The present invention relates to a semiconductor integrated circuit which can be operated by low voltage.

2. Description of the Related Art

Power consumption of the semiconductor integrated circuit is mainly decided by the product of electrostatic capacity, operating voltage, and the operation frequency. The amount of the power consumption becomes proportion to the square of the operating voltage (power supply voltage). Therefore, lowering the operating voltage is very effective for lowering the power consumption of the semiconductor integrated circuit. Then, various methods have been developed for the low voltage operation of the semiconductor integrated circuit.

For instance, Tokkai-Hei08-181593 unexamined Japanese patent application indicates a semiconductor integrated circuit for decreasing its power consumption by supplying a minimum voltage which does not cause a malfunction operation at the critical path, which minimum voltage is detected and determined in advance by using a dummy circuit for the critical path of the semiconductor integrated circuit and a voltage regulator.

However, when the power supply voltage of the entire integrated circuit is lowered, the following problems are caused. If the power supply voltage is lowered, the delay time of each gate of the semiconductor and the delay time depending on the wiring capacity (load capacity) will increase while consumption current decreases. Especially, because accurate estimation of the wiring capacity (load capacity) is difficult, a relative timing skew is included in the delay time depending on the wiring capacity (load capacity). For instance, regarding a synchronized semiconductor integrated circuit, the synchronized operation based on standard clock among block modules is necessary for the normal correct operation. The clock skew among block modules can be a cause for serious malfunctioning. Clock wiring patterns are installed to various direction in various form, so that it is very difficult to match and cancel the slew to 0 accurately among entire blocks at the design stage in consideration of all load capacity correctly. If the power supply voltage is lowered under above mentioned status, the difference of the amount of the delay among blocks becomes large because of the collapse of the load balance, and it causes the malfunction operation.

Moreover, slew (slew of transient response) of the transmitted waveform becomes not steep in the designed circuit which uses a low speed gate. If the output waveform become dull, the timing design becomes remarkably complex because the influence for the delay time by the slew of the waveform become large when the threshold of an internal circuit changes by the fluctuation of the process condition.

SUMMARY OF THE INVENTION

Therefore, with the foregoing in mind, it is an object of the present invention to provide a semiconductor circuit which can operate by low power supply voltage.

In order to achieve the objects, a semiconductor integrated circuit includes a processing means, a driving means which has, as an input, the output of the processing means and a slew adjustment means for detecting the slew of the transient response of the output waveform of the driving means and adjusting the slew based on the result of the slew detection.

This embodiment makes it possible to adjust the timing skew depending on the difference of the slew in the output waveform of the driving circuit. The stable operation of the synchronous integrated circuit can be achieved.

Next, the slew adjustment means of the present invention preferably includes a mode control circuit for switching a mode of the entire semiconductor integrated circuit to either a slew adjustment mode or a normal operation mode. The slew adjustment means switches the mode to the normal operation mode after adjusting the slew in the slew adjustment mode.

This embodiment makes it possible to perform slew adjustment surely because the slew adjustment means changes the mode to the normal operation mode after slew adjustment of the semiconductor integrated circuit.

Next, the slew adjustment means of the present invention preferably further includes a slew detection circuit for detecting the slew of the transient response in the output waveform of the driving means, a power supply voltage control circuit for controlling the power supply voltage supplied to the driving circuit according to the detection result of the slew detection circuit.

In this embodiment, the slew adjustment means includes the slew detection circuit and the power supply control circuit, the power supply voltage supplied to the driving means can be adjusted according to the detection result of the slew of the transient response in the output waveform of the driving means. Therefore, this embodiment makes it possible to adjust the driving voltage to the lowest voltage by which the amount of slew can be reduced within the predetermined range and achieve the low power consumption of the semiconductor integrated circuit.

Next, the slew detection circuit of the present invention preferably further includes a first comparator for comparing the voltage of the inputted signal and a first reference voltage, a second comparator for comparing the voltage of the inputted signal and a second reference voltage and a timer starting counting according to the output of the first comparator.

This embodiment makes it possible to surely measure the transient building up time of the voltage signal from the first reference voltage to the second reference voltage, and detect whether the amount of the slew is within the predetermined range or not.

Next, the driving means of the present invention preferably further includes a level shift circuit for converting the output voltage of the processing means to the voltage supplied from the power supply voltage control circuit.

This embodiment makes it possible to cut off the output of driving means completely even if the power supply voltage of the processing means is considerably lower than the power supply voltage of the driving means. Therefore, the power supply voltage of the processing means can be decreased up to a minimum voltage.

Next, the driving means of the present invention preferably further includes plural driving circuits and the plural driving circuits are grouped. Each group comprises the slew adjustment means, the slew adjustment means switches the mode to the normal operation mode after completing all slew adjustment in all slew adjustment means.

In this embodiment, the driving circuits are grouped according to the similarity of the condition such as the wiring pattern length and parasite capacitance which can be the cause for the slew, and the slew adjustment means can be installed in the driving circuit in each group. This embodiment makes it possible to achieve optimum slew adjustment by each group. Therefore, effective and fine slew adjustment can be achieved in consideration of reducing the added element.

Next, the driving means of the present invention preferably includes plural clock buffers.

By this embodiment, the present invention can be applied to the clock buffers where the timing skew could be a serious problem in general.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention of the semiconductor integrated circuit will be described by way of embodiments with reference to the accompanying drawings.

EMBODIMENT 1

Figure 1:
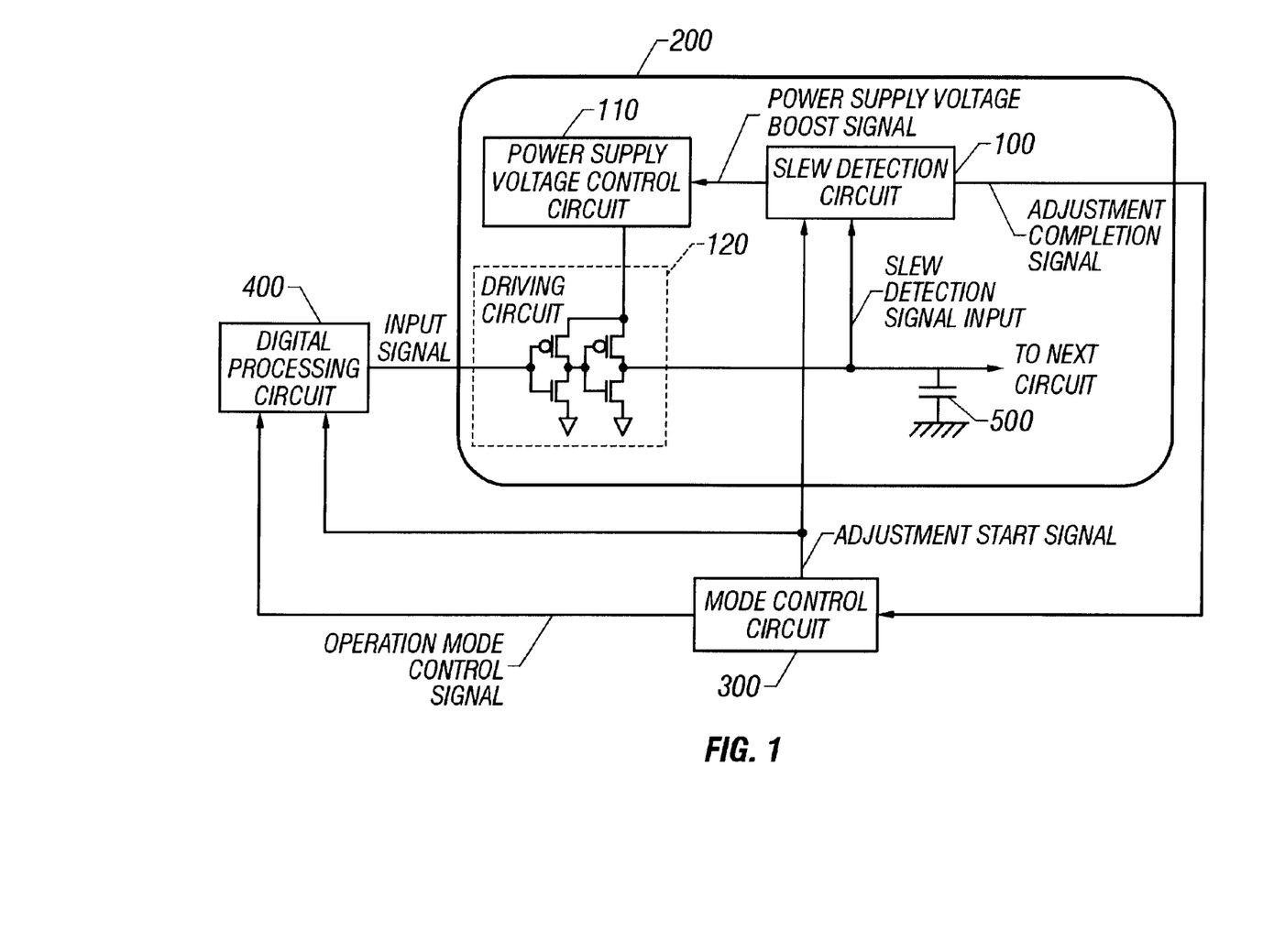
FIG. 1 is a schematic block diagram showing an outline configuration of a semiconductor integrated circuit according the Embodiment 1 of the present invention.
Figure 2:
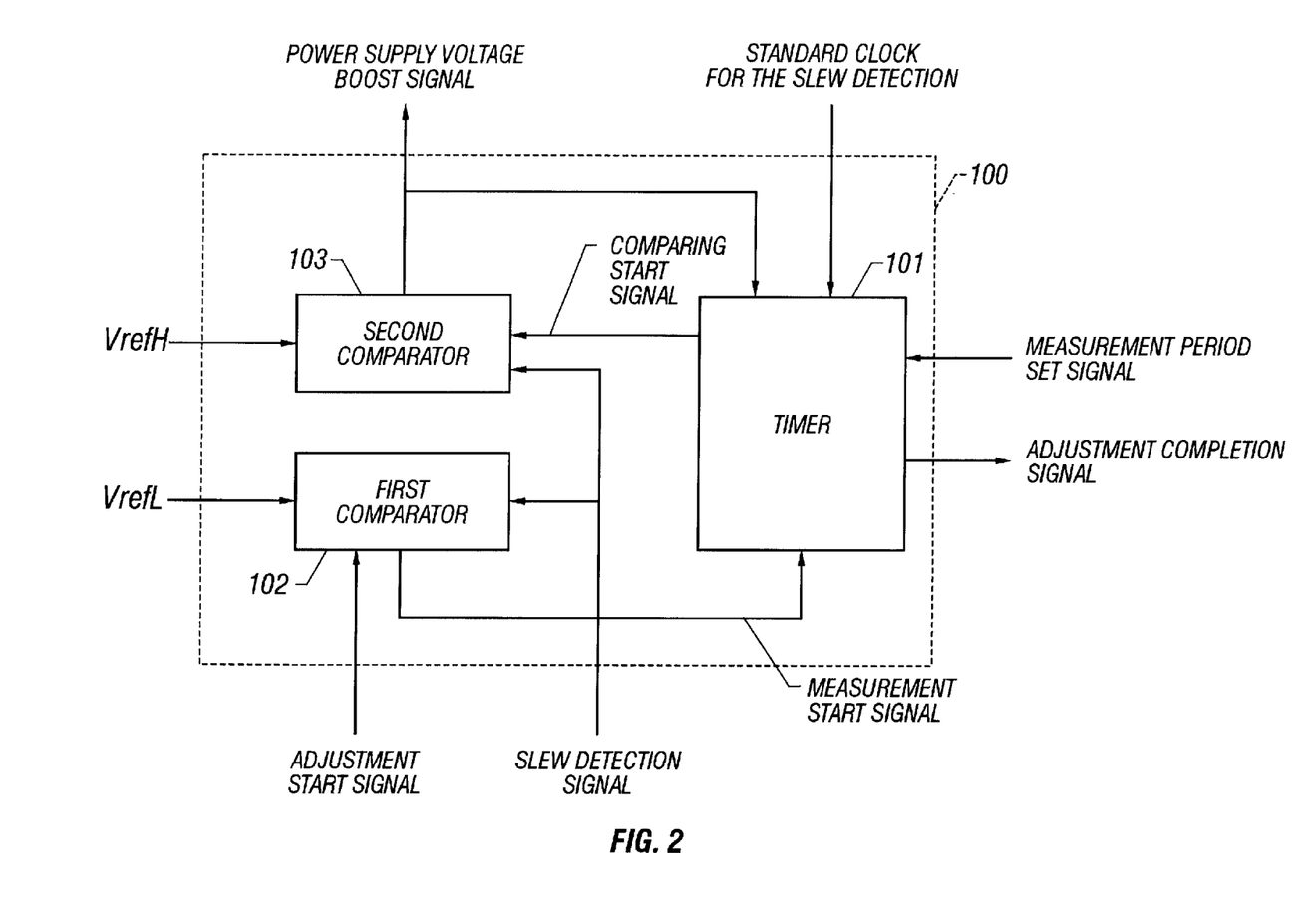
FIG. 2 is a schematic block diagram showing an example configuration of a slew detection circuit of the semiconductor integrated circuit shown in the FIG. 1.
Figure 3:
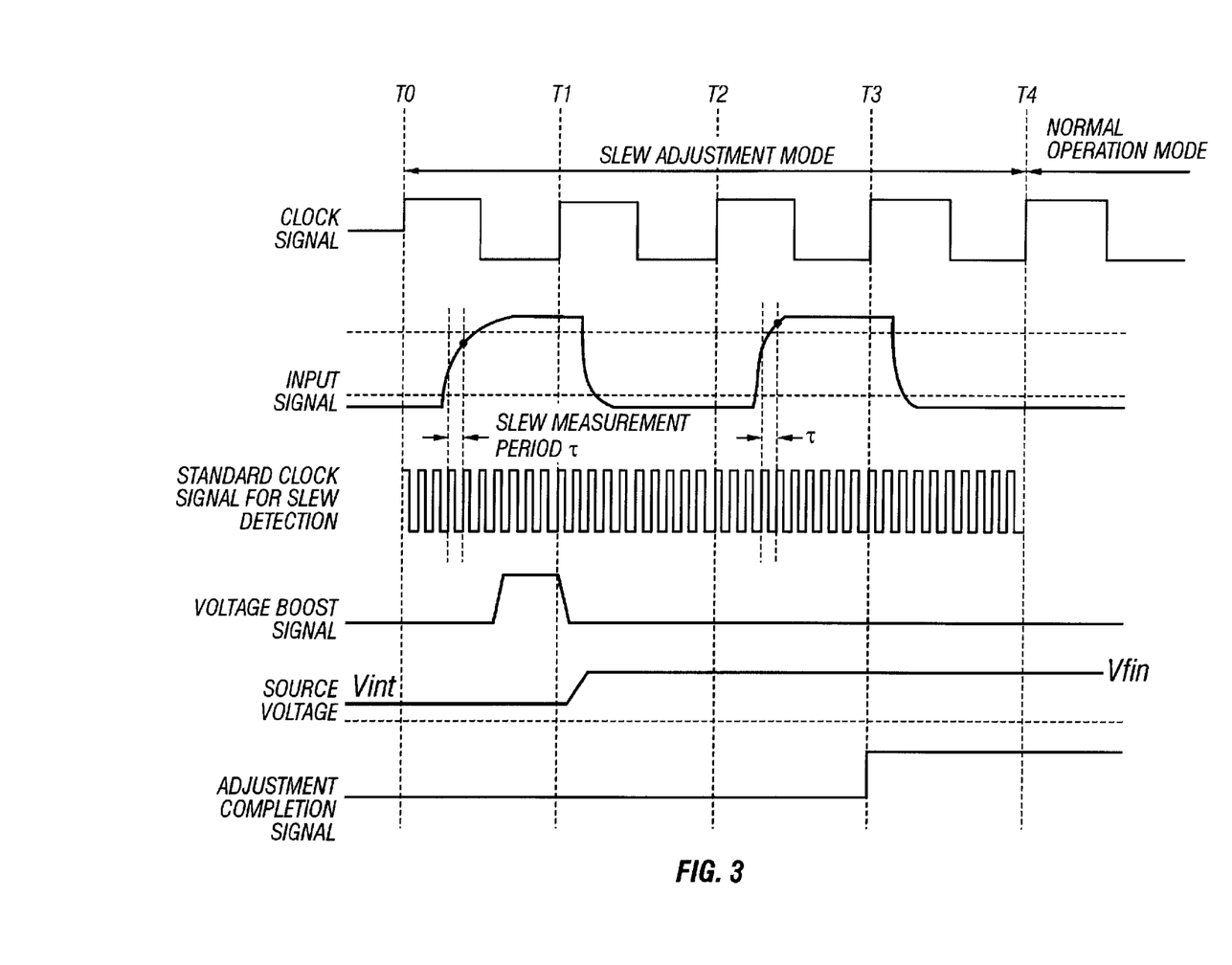
FIG. 3 is a timing chart showing a operation of the semiconductor integrated circuit shown in the FIG. 1.

FIG. 1 is a schematic block diagram showing an outline configuration of a semiconductor integrated circuit. FIG. 2 is a schematic block diagram showing an example configuration of a slew detection circuit 100 of the semiconductor integrated circuit shown in the FIG. 1. FIG. 3 is a timing chart showing a operation of the semiconductor integrated circuit shown in the FIG. 1.

As shown in FIG. 1, the semiconductor integrated circuit of this embodiment 1 roughly includes a digital processing circuit 400 as an processing means, a driving circuit 120 as a driving means, and the following 3 elements, a slew detection circuit 100, a power supply voltage controller 110 and a mode controller 300 as a slew adjustment means. In this example configuration shown in FIG. 1, the driving circuit 120, the slew detection circuit 100 and the power supply voltage controller 110 are installed on one unit collectively as a slew adjustment unit 200, and the mode controller 300 is installed outside of the slew adjustment unit 200 considering convenience in manufacturing. 500 indicates wiring capacity (load capacity).

The digital processing circuit 400 provides a predetermined input (transient build-up waveform) signal to the driving circuit 120 in the slew adjustment mode as described later.

The driving circuit 120 is driven by the output of the digital processing circuit 400 as an input signal, and the driving circuit 120 supplies output signal to load (wiring capacity 500).

The slew detection circuit 100 detects the slew (slew of the transient response) of the output waveform of the driving circuit 120.

The power supply voltage control circuit 110 controls the power supply voltage supplied to the driving circuit 120. The power supply voltage control circuit 110 includes a DC—DC converter for instance.

The mode control circuit 300 is a control circuit which switches the operation mode of the semiconductor integrated circuit to either of the slew adjustment mode or the normal operation mode. Here, the slew adjustment mode is a mode for the slew adjustment whose period is set immediately after the semiconductor integrated circuit starts driving. As shown in FIG. 3, the period of the slew adjustment mode is assigned as the period from the start of driving of the semiconductor integrated circuit (T0) until the clock risingup timing which follows after the slew adjustment has been completed. In the example of FIG. 3, the completion of the slew adjustment can be confirmed by the second transient build-up waveform input of input signals. Therefore, from T0 to T4 is assigned as the slew adjustment mode. The normal operation mode is a mode for a normal original operation of the semiconductor integrated circuit following the slew adjustment mode. It starts after T4 in the example of FIG. 3.

Next, the slew adjustment means is described in detail. The slew adjustment means includes the slew detection circuit 100, the power supply voltage control circuit 110, and the mode control circuit 300 as mentioned above. FIG. 2 is a schematic block diagram showing an example configuration of the slew detection circuit 100 of the semiconductor integrated circuit shown in the FIG. 1. This slew detection circuit 100 includes a first comparator 102, a second comparator 103 and a timer 101. The first comparator 102 compares the reference voltage VrefL as a lower reference voltage at slew detection with the output voltage of the driving circuit 120. The second comparator 103 compares the reference voltage VrefH as a higher reference voltage at slew detection with the output voltage of the driving circuit 120. The timer 101 starts counting after the first comparator 102 issues a measurement start signal by detecting when the output voltage of the driving circuit 120 becomes equal to the VrefL.

In the timing chart of FIG. 3, the supply voltage supplied to the driving circuit 120 by the power supply voltage control circuit 110 has been set at voltage Vint near a normally operable lowest voltage before the initial status of the time T0 when the power supply is turned on. At this time, the mode of the semiconductor integrated circuit is set to the slew adjustment mode controlled by the mode control circuit 300.

At time T0, mode control circuit 300 issues the adjustment start signal (for instance, high signal) to the first comparator 102 in slew adjustment unit 200 and the digital processing circuit 400. The digital processing circuit 400 outputs the test signal (for instance, square waveform signal) to the driving circuit 120. The first comparator 102 starts the comparison operation and issues the measurement start signal to the timer 101 when the output voltage of the driving circuit 120 reaches the lower reference voltage VrefL for the slew detection. The slew measurement period τ for the slew detection has been set in timer 101 in advance, and when this slew measurement period τ passes, a comparison start signal is issued to the second comparator 103 which compares the output voltage of the driving circuit 120 with the higher reference voltage VrefH. The slew of the voltage waveform can be detected simply by comparing the time it takes the output voltage to go from the lower reference voltage VrefL to the higher reference voltage VrefH with the period of the measurement period τ. In this embodiment, if the first comparator 102 detects the voltage waveform reaching the lower reference voltage VrefL, the timer 101 starts the counting. The slew detection is performed by determining whether the voltage signal is beyond the higher reference voltage VrefH or not when the timer 101 counts up the slew measurement period τ. In FIG. 3, the round period of a standard clock for slew detection corresponds to the slew measurement period τ.

When the measurement period τ passes, if the transient build-up waveform, that is the voltage waveform of the driving circuit, does not exceed the higher reference voltage VrefH, the slew of the voltage waveform is more gradual than the predetermined tolerated slew (Transient response is slow). In this case, a power supply voltage boost signal is issued to the power supply voltage control circuit 110 in order to improve the response speed of the transient response. As a result, the power supply voltage supplied to the driving circuit 120 as shown in FIG. 3 is increased from Vint to Vfin at time T1. The power supply voltage boost signal is also output to the timer 101 for detecting the end of the comparison. By this configuration, the Timer 101 can detect the slew adjustment completion when the power supply boost signal is not issued.

The test waveform is outputted from the digital processing circuit 400 to the driving circuit 120 gain at time T2 because the adjustment start signal issued by the mode control circuit 300 at time T0 has been maintained, and the slew detection by the slew detection circuit 100 is executed again. The second time transient response of the voltage waveform after the power supply voltage is increased to Vfin becomes faster, and the voltage reaches the higher reference voltage VrefH from the lower reference voltage VrefL in the slew measurement period τ in this example of FIG. 3. In this example, the slew becomes steeper than the tolerated slew. Therefore, the second comparator 103 does not issue the power supply boost signal because there is no need for increasing the power supply voltage anymore. The timer 101 detects that the power supply boost signal has been stopped, and the timer 101 issues the adjustment completion signal to the mode control circuit 300 at time T3 as shown in FIG. 3. By those processes, the end of the slew adjustment period is detected. When the mode control circuit 300 receives the adjustment completion signal, the mode control circuit 300 shifts the mode of the digital processing circuit 400 to the normal operation mode. That is, the digital processing circuit 400 stops the output of the test waveform, and normal processing will be started. When shifting to the normal operation mode, the power supply voltage supplied to the driving circuit 120 is fixed to the current value. With this power supply voltage, the slew of transient response in the node with a heavy load will be steeper than the tolerated slew.

As described above, according to this embodiment 1, the power supply voltage of the digital processing circuit 400 is set low by controlling the power supply voltage supplied to the driving circuit 120 (output circuit) independently of the power supply voltage of the digital processing circuit 400 and the low power consumption can be achieved and the slew of the output waveform is controlled appropriately. It is possible to reduce the influence of the delay time by the slew of the waveform when the threshold of internal circuits are fluctuated by the process condition etc. Furthermore, the timing design becomes easier.

As described above in this embodiment, the timing skew at the transient build-up part of the signal waveform (transient response) is used for the slew detection. However, the timing skew at the fall part of the signal waveform can be used instead. Moreover, the timing skew at both transient build-up part and fall part of the signal waveform can be used for the slew detection. In this case, the cycle of the power supply voltage adjustment can be shortened and the shift to the normal mode can be performed earlier.

In the above description, the power supply control circuit 110 is explained assuming that DC—DC converter is included. However, any power supply control circuit can be used if it can perform the variable control for the power supply voltage.

Figure 4:
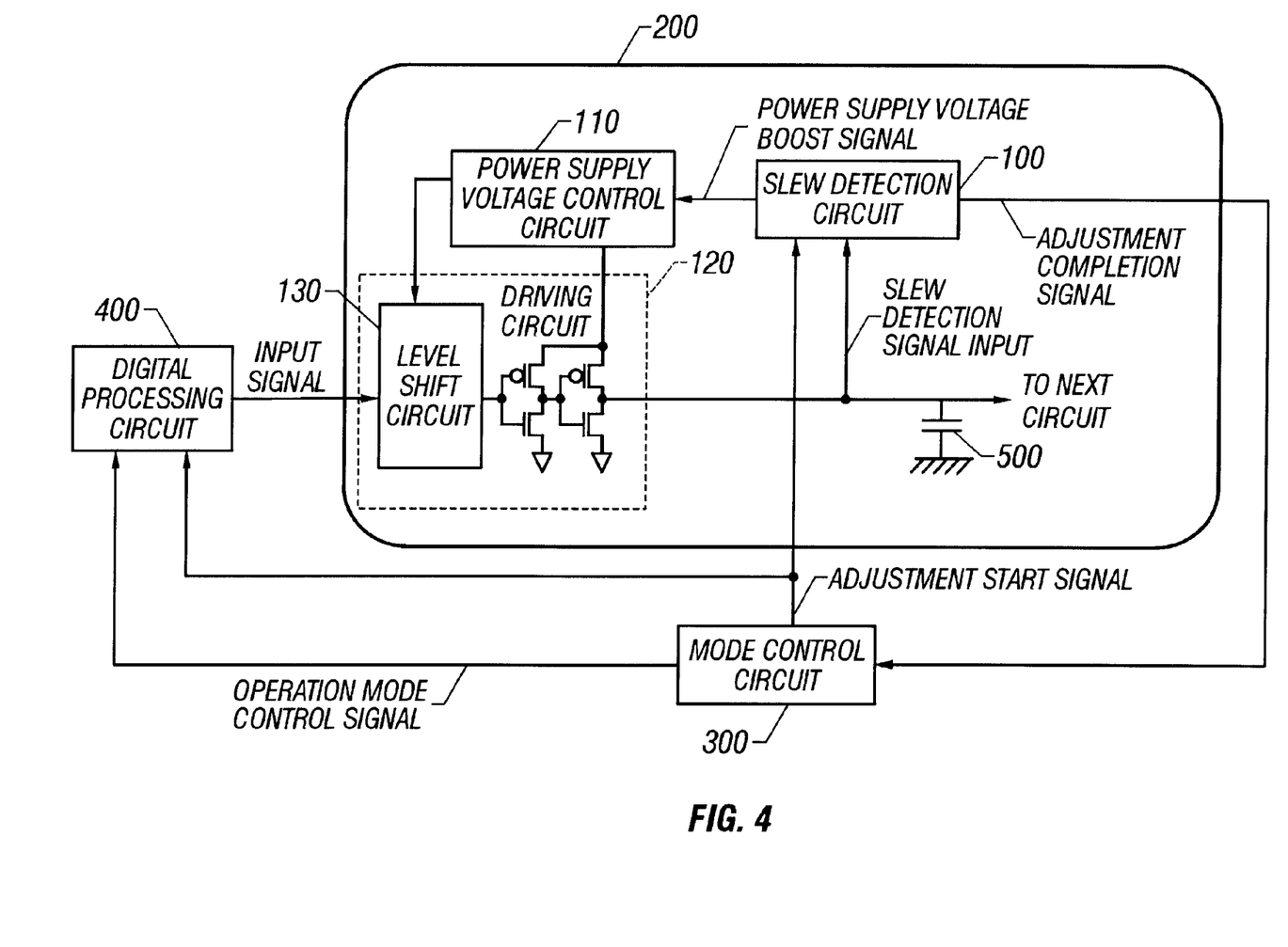
FIG. 4 is a schematic block diagram showing an another configuration of a slew detection circuit of the semiconductor integrated circuit shown in the FIG. 1.

Next, another example configuration of this embodiment is described below. As shown in FIG. 4, the driving circuit 120 includes a level shift circuit 130 for converting the voltage level of the output signal from the digital processing circuit 400.

By this configuration, the power supply voltage supplied to the digital processing circuit 400 can be set lower. When optimizing the effect of the low power consumption by setting the power supply voltage of the digital processing circuit 400 to a minimum voltage necessary for correct operation and setting only the power supply voltage of the driving circuit 120 to the higher voltage, the voltage of the gate of the transistor of driving circuit 120 cannot secure enough margin to the threshold if the difference between the supplied voltage Vbuf of the power supply voltage of the driving circuit 120 and the power supply voltage Vdig of the digital processing circuit 400 is too large.

As a result, the output of the driving circuit 120 may not be cut off completely. In order to avoid this problem, the driving circuit 120 of the semiconductor integrated circuit shown in FIG. 4 includes the level shift circuit 130 which converts the voltage of the output signal from the digital processing circuit 400 to the power supply voltage of the driving circuit 120. By this configuration, the output of driving circuit 120 can be cut off completely even if the power supply voltage of the digital processing circuit 400 is considerably lower than the power supply voltage of the driving circuit 120. Therefore, the power supply voltage of the digital processing circuit 400 can be decreased up to a minimum voltage.

EMBODIMENT 2

Regarding the semiconductor integrated circuit of this embodiment 2, the driving means are the plural driving circuits, and these driving circuits are grouped into units according to the similarity of its conditions such as the wiring pattern length and the parasitic capacitance. The slew adjustment means is installed in each group in this embodiment 2. The optimum slew adjustment is performed by each group and the semiconductor integrated circuit shift its mode to the normal operation mode only after all slew adjustment in all groups have been completed. In this embodiment 2, the clock buffers are applied as plural driving circuits.

The semiconductor integrated circuit of this embodiment 2 includes the plural clock buffers in order to provide and distribute clock signals to entire semiconductor integrated circuit, those clock buffers are grouped according to the size of the slew and depending on the wiring pattern length and the parasitic capacitance, etc. and the slew adjustment means are provided to each clock buffer in each group.

Figure 5:
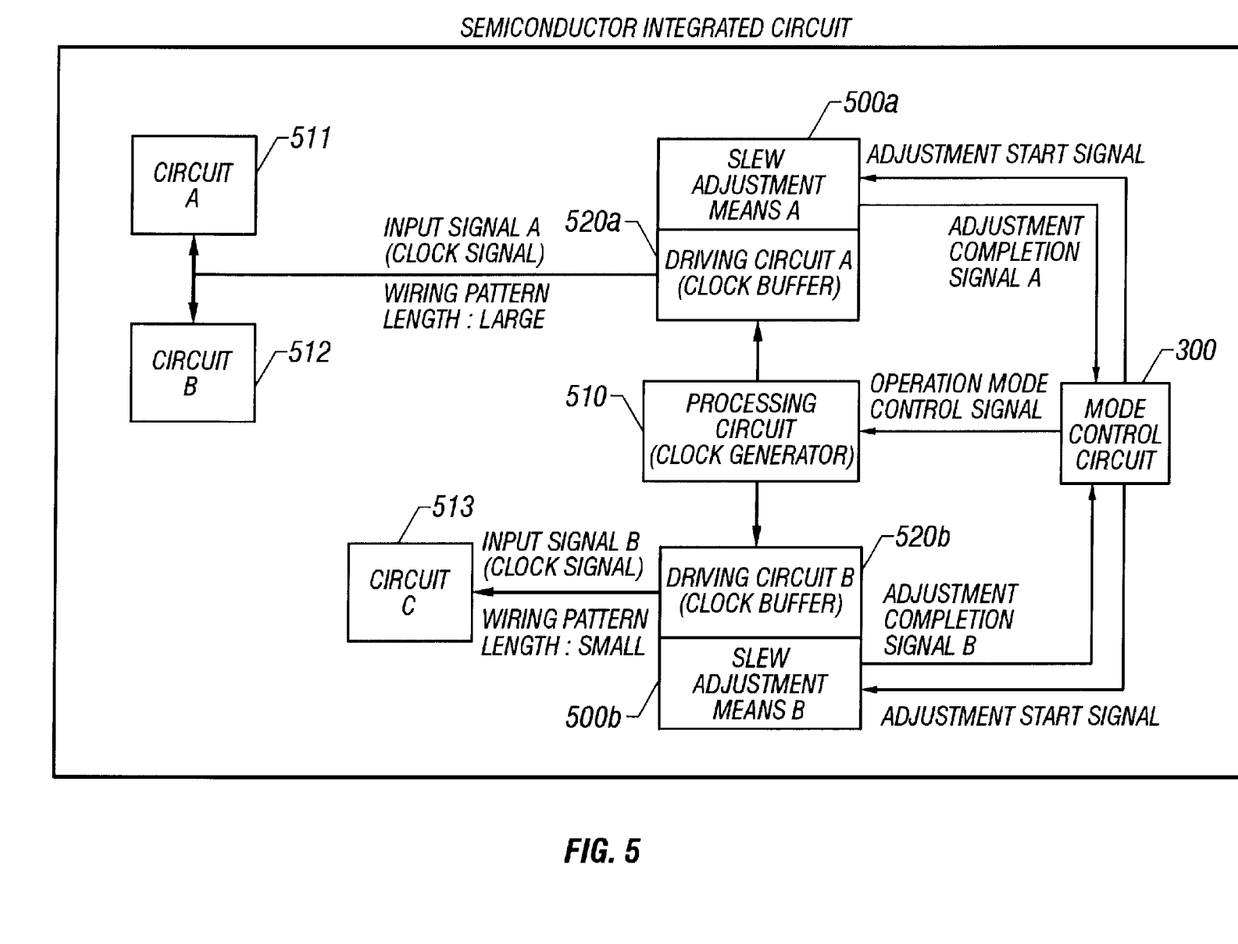
FIG. 5 is a schematic diagram showing a concept of group as a unit for installing a slew adjustment means of the embodiment 2 of the present invention.
Figure 6:
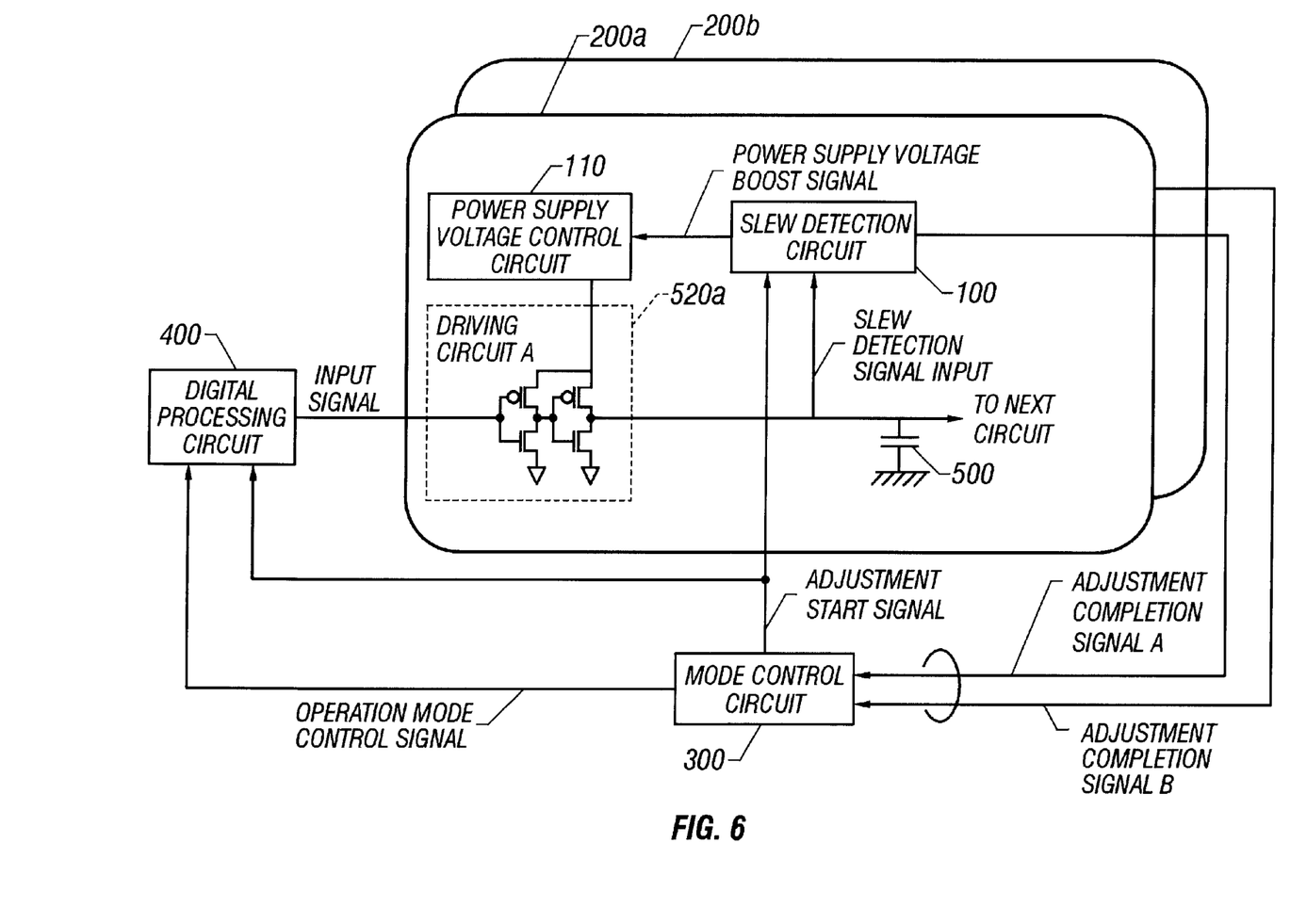
FIG. 6 is a schematic block diagram showing an outline configuration of a semiconductor integrated circuit according to Embodiment 2 of the present invention.
Figure 7:
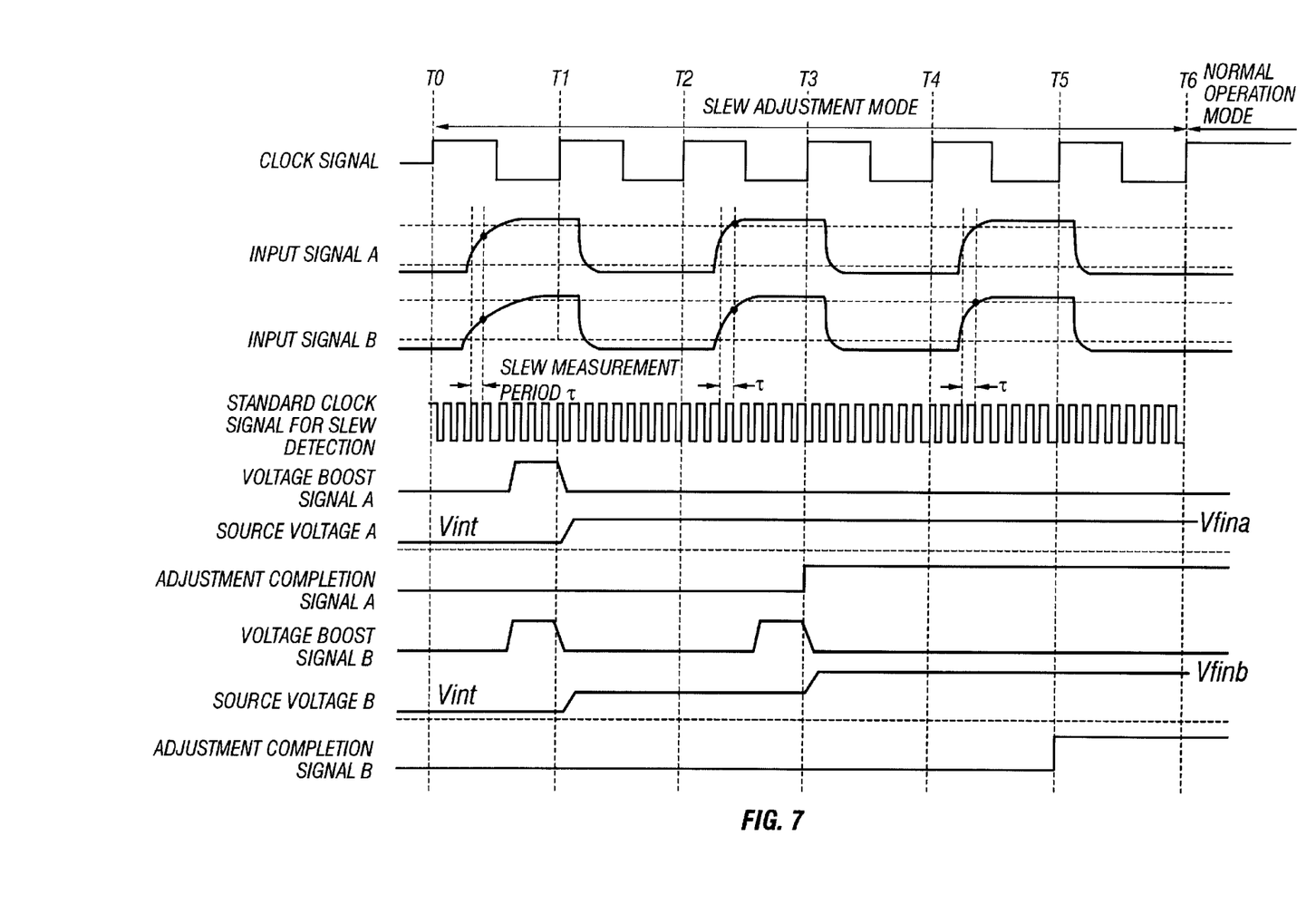
FIG. 7 is a timing chart showing operation of the semiconductor integrated circuit shown in the FIG. 6.

FIG. 5 is a schematic diagram showing a concept of group as a unit for installing a slew adjustment means. FIG. 6 is a schematic block diagram showing an outline configuration of a semiconductor integrated circuit and FIG. 7 is a timing chart showing a operation of the semiconductor integrated circuit.

In the example shown in FIG. 5, two slew adjustment means, which are a slew adjustment means A 500a and a slew adjustment means B 500b, are installed. This slew adjustment means A 500a and the slew adjustment means B 500b are installed in the driving circuit A 520a and the driving circuit B 520b which are the clock buffers respectively. The basic processing of the slew adjustment means A 500a and the slew adjustment means B 500b are the same as the slew adjustment means described in the embodiment 1. For the convenience of the description, the mode control part 300 is drawn outside of the slew adjustment means. The mode control part 300 which is common to the slew adjustment means A 500a and the slew adjustment means B 500b is installed. The basic operation of the mode control part 300 is the same as that of the mode control part 300 explained in embodiment 1 except for the mode shift operation. It shifts the slew adjustment mode to the normal operation mode after detecting the completion of the slew adjustment processing in all slew adjustment means as describe later.

510 is a processing circuit (clock generator) which is the processing means. 511, 512 and 513 are circuit A–C such as logic circuit. A circuit A 511 and a circuit B 512 are located in the position far from the clock generator 510 and are grouped into a group whose parasitic capacitance is large because of the wiring pattern length for the clock supply is large. A circuit C 513 is located in the position near the clock generator 510 and is grouped into a group whose parasitic capacitance is small because of the wiring pattern length of the clock supply is small.

The slew caused in the clock signal supplied to the circuit A 511 and circuit B 512 which belong to a group having long wiring pattern length for the clock supply can be expected to be to the same extent because conditions of both wiring pattern length and parasitic capacitance, etc. resemble each other. Therefore, the driving circuit A 520a can be used commonly as the clock buffers for supplying the clock to both circuit A 511 and circuit B 512. In order to adjust the slew caused in the clock supplied to circuit A 511 and circuit B 512 through the driving circuit A 520a, an adjustment means A 500a is installed.

On the other hand, it can be expected that the slew caused in the clock signal supplied to the circuit C 513 which belongs to a group having small wiring pattern length for the clock supply is different from the slew caused in the clock signal supplied to the circuit A 511 and circuit B 512 because conditions of the wiring pattern length and the parasitic capacitance, etc. are different. Then, the driving circuit B 520b is used as another clock buffer, and the slew adjustment means B 500b is installed in order to adjust the slew caused in the clock supplied to the circuit C 513 through driving circuit B 520b.

The number of the groups for installing the slew adjustment means is two in this embodiment, which are the group having long wiring pattern length and the group having small wiring pattern length. However, it is not limited to two. Circuits are divided into groups according to the conditions such as the parasitic capacitance which cause the slew, the slew adjustment for circuits can be performed group by group by installing the slew adjustment circuit to each clock buffer which supplies clock to the circuits in each group. Therefore, efficient and fine slew adjustment can be achieved in consideration of reducing the added element.

FIG. 6 is a schematic block diagram showing an outline configuration of a semiconductor integrated circuit considering convenience in manufacturing. In this example configuration, the driving circuit A 520a which is the clock buffer, the slew detection circuit 100 and the power supply voltage control circuit 110 are grouped into one unit as a slew adjustment unit 200a, the driving circuit B 520b which is the clock buffer, the slew detection circuit 100 and the power supply voltage control circuit 110 are grouped into one unit as a slew adjustment unit 200b respectively, and the mode control circuit 300 is installed outside of the slew adjustment unit 200a and the slew adjustment unit 200b as a common element.

Next, FIG. 7 is a timing chart showing an operation of the semiconductor integrated circuit shown in the FIG. 6.

The objects for the slew adjustment are expanded to plural clock buffers in this embodiment 2. FIG. 7 shows that the adjustment completion signal is issued for the first time at time T6 when the slew adjustment with all driving circuits are complete, and it shows the appearance of the turning of the mode from the slew adjustment mode to the normal operation mode. The slew adjustment is performed to each power supply voltage control circuit 110 until the slew adjustment mode is completed for adjusting the slew of each output waveform to become steeper than the tolerated slew.

The timing chart shown in FIG. 7, regarding the input signal A supplied to the circuit A 511 and circuit B 512 from the driving circuit A 520a (as a clock buffer) through the slew adjustment unit 200a, the power supply boost signal A is outputted once after the slew measurement is finished after the time T0, then the slew adjustment is performed by that power supply voltage A increased from Vint to Vfina and the completion of the slew adjustment is detected by the slew measurement after T2. Therefore, an adjustment completion signal A of the slew adjustment unit 200a is outputted at time T3.

However, regarding the input signal B supplied to the circuit C 513 from the driving circuit B 520b (as a clock buffer) through the slew adjustment unit 200b, the adjustment completion signal B is not issued at time T4 because incompletion of the slew adjustment is detected by the slew measurement after T2. In this example, the second time of the supply voltage boost signal B is issued and the slew adjustment is performed by boosting the power supply voltage B to Vfinb, then the completion of the slew adjustment is detected by the slew measurement after T5. The AND logic of the adjustment completion signal A and the adjustment completion signal B is treated as an adjustment completion signal of entire circuit. As a result, adjustment completion signal B is issued at time T5. The operation mode control signal is switched at T6, and the mode control circuit 300 switches the operation mode of the semiconductor integrated circuit from the slew adjustment mode to the normal operation mode.

The wiring pattern for the clock is installed to various direction in the integrated circuit. Therefore, generally speaking, it is very difficult to match the slew to 0 accurately among all blocks at the design stage in consideration of all load capacity. According to above embodiments of the present invention, even though various amount of load is connected to the output part of the clock buffer respectively, the difference in the amount of the time delay depending on imbalance of the load can be reduced and the occurrence of the malfunction can be reduced. After the slew adjustment completes, a needless electric power consumption can be avoided because the optimum power supply voltage is set by each clock buffer output part corresponding to the balance of loads of the driving circuit and driving ability, and the low power consumption can be achieved.

In the above embodiments of the present invention, the control of the slew adjustment of the output waveform is achieved by controlling the power supply voltage which is supplied to the driving circuit. The control of the slew adjustment of the output waveform can be achieved by other means such as means for controlling the threshold voltage by changing the substrate potential of the transistor of the driving circuit.

As described above, according to the semiconductor integrated circuit of this invention related to claims 1 to 7, the amount of the slew can be reduced to within the predetermined range by detecting the slew in the transient response of the voltage waveform of the driving means, and adjusting the slew. The fluctuation of the delay depending on the dullness of the waveform becomes small even when the process fluctuation is occurred because there is no node where the voltage waveform becomes greatly dull, and the semiconductor integrated circuit which can be operated stably under the low voltage driving.

According to the semiconductor integrated circuit of this invention related to claim 3, because the slew adjustment means contains the slew detection circuit and the power supply voltage control circuit, and it adjusts the power supply voltage supplied to the driving means based on the result of the detection of the slew of the transient response in the output waveform of the driving means, the low voltage drive using the lowest voltage by which the amount of the slew can be suppressed within the predetermined range can be achieved and this low voltage drive leads to low power consumption of the semiconductor integrated circuit.

According to the semiconductor integrated circuit of this invention related to claim 6, the semiconductor integrated circuit comprises plural driving circuits as driving means and the plural driving circuits are grouped according to the similarity of the condition such as wiring pattern length and parasite capacitance. By installing slew adjustment means in the group respectively, the optimum slew adjustment can be achieved. Therefore, effective and fine slew adjustment can be achieved.

The semiconductor integrated circuit can shift its mode to the normal operation mode after all slew adjustment are surely completed in all groups because system mode is shifted to the normal operation mode only after all the slew adjustments of the slew adjustment means are completed. As a result, the stable operation of the synchronous integrated circuit can be achieved easing the timing skew depending on the difference of the slew among the plural blocks.

Moreover, according to claim 7 of the present invention, the above mentioned plural driving circuits are applied to the clock buffers.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A semiconductor integrated circuit comprising:
   a processing means;
   a driving means which inputs the output of the processing means;
   a slew adjustment means for detecting a slew of the transient response of an output waveform of the driving means and adjusting the slew according to the result of the detected degree of the slew detection wherein
   the slew adjustment means comprises a mode control circuit for switching a mode of the entire semiconductor integrated circuit to either a slew adjustment mode or a normal operation mode, the slew adjustment means switches the mode to the normal operation mode after adjusting the slew in the slew adjustment mode.

2. The semiconductor integrated circuit according to the claim 1, wherein
   the slew adjustment means comprises a slew detection circuit for detecting the slew of the transient response in the output waveform of the driving means, a power supply voltage control circuit for controlling a power supply voltage supplied to the driving circuit according to the detection result of the slew detection circuit.

3. The semiconductor integrated circuit according to the claim 2, wherein
   the slew detection circuit comprises a first comparator for comparing a voltage of the inputted signal and a first reference voltage, a second comparator for comparing the voltage of the inputted signal and a second reference voltage, and a timer for starting counting according to an output of the first comparator.

4. The semiconductor integrated circuit according to the claim 3, wherein
   the driving means comprises a level shift circuit for converting an output voltage of the processing means to a voltage supplied from a power supply voltage control circuit.

5. The semiconductor integrated circuit according to the claim 3, wherein
   the driving means comprises plural driving circuits and the plural driving circuits are grouped, each group contains the slew adjustment means, the slew adjustment means switches the mode to the normal operation mode after completing all slew adjustment in all slew adjustment means.

6. The semiconductor integrated circuit according to the claim 5, wherein
   the driving means comprises plural clock buffers.

7. The semiconductor integrated circuit according to the claim 2, wherein
   the driving means comprises a level shift circuit for converting an output voltage of the processing means to a voltage supplied from a power supply voltage control circuit.

8. The semiconductor integrated circuit according to the claim 1, wherein
   the driving means comprises a level shift circuit for converting an output voltage of the processing means to a voltage supplied from a power supply voltage control circuit.

9. The semiconductor integrated circuit according to the claim 1, wherein
   the driving means comprises plural driving circuits and the plural driving circuits are grouped, each group contains the slew adjustment means, the slew adjustment means switches the mode to the normal operation mode after completing all slew adjustment in all slew adjustment means.

10. The semiconductor integrated circuit according to the claim 9, wherein the driving means comprises plural clock buffers.

11. A semiconductor integrated circuit comprising:

a processing means;

a driving means which inputs the output of the processing means;

a slew adjustment means for detecting a slew of the transient response of an output waveform of the driving means and adjusting the slew according to the result of the detected degree of the slew detection wherein the slew adjustment means comprises a slew detection circuit for detecting the slew of the transient response in the output waveform of the driving means, a power supply voltage control circuit for controlling a power supply voltage supplied to the driving circuit according to the detection result of the slew detection circuit.

12. The semiconductor integrated circuit according to the claim 11, wherein the slew detection circuit comprises a first comparator for comparing a voltage of the inputted signal and a first reference voltage, a second comparator for comparing the voltage of the inputted signal and a second reference voltage, and a timer for starting counting according to an output of the first comparator.

13. The semiconductor integrated circuit according to the claim 12, wherein the driving means comprises a level shift circuit for converting an output voltage of the processing means to a voltage supplied from a power supply voltage control circuit.

14. The semiconductor integrated circuit according to the claim 11, wherein the driving means comprises a level shift circuit for converting an output voltage of the processing means to a voltage supplied from a power supply voltage control circuit.

15. The semiconductor integrated circuit according to the claim 11, wherein the driving means comprises plural driving circuits and the plural driving circuits are grouped, each group contains the slew adjustment means, the slew adjustment means switches the mode to the normal operation mode after completing all slew adjustment in all slew adjustment means.

16. The semiconductor integrated circuit according to the claim 15, wherein the driving means comprises plural clock buffers.

17. A semiconductor integrated circuit comprising:

a processing means;

a driving means which inputs the output of the processing means;

a slew adjustment means for detecting a slew of the transient response of an output waveform of the driving means and adjusting the slew according to the result of the detected degree of the slew detection wherein the driving means comprises a level shift circuit for converting an output voltage of the processing means to a voltage supplied from a power supply voltage control circuit.

18. A semiconductor integrated circuit comprising:

a processing means;

a driving means which inputs the output of the processing means;

a slew adjustment means for detecting a slew of the transient response of an output waveform of the driving means and adjusting the slew according to the result of the detected degree of the slew detection wherein the driving means comprises plural driving circuits and the plural driving circuits are grouped, each group contains the slew adjustment means, the slew adjustment means switches the mode to the normal operation mode after completing all slew adjustment in all slew adjustment means.

19. The semiconductor integrated circuit according to the claim 18, wherein the driving means comprises plural clock buffers.

* * * * *